(12) United States Patent
Auer et al.

(10) Patent No.: US 9,425,378 B2
(45) Date of Patent: Aug. 23, 2016

(54) ACTUATOR, ACTUATOR SYSTEM AND ACTUATION OF AN ACTUATOR

(75) Inventors: Christoph Auer, Graz (AT); Reinhard Gabl, Kufstein (AT)

(73) Assignee: EPCOS AG, Munich (DE)

( * ) Notice: Subject to any disclaimer, the term of this patent is extended or adjusted under 35 U.S.C. 154(b) by 326 days.

(21) Appl. No.: 13/995,939

(22) PCT Filed: Nov. 10, 2011

(86) PCT No.: PCT/EP2011/069853
§ 371 (c)(1),
(2), (4) Date: Sep. 19, 2013

(87) PCT Pub. No.: WO2012/084334
PCT Pub. Date: Jun. 28, 2012

(65) Prior Publication Data
US 2014/0001920 A1    Jan. 2, 2014

(30) Foreign Application Priority Data
Dec. 22, 2010    (DE) .................. 10 2010 055 620

(51) Int. Cl.
*H01L 41/09*    (2006.01)
*H01L 41/047*   (2006.01)
*H01L 41/083*   (2006.01)
*H02N 2/06*     (2006.01)
*H01L 41/04*    (2006.01)

(52) U.S. Cl.
CPC .......... *H01L 41/0472* (2013.01); *H01L 41/042* (2013.01); *H01L 41/0471* (2013.01); *H02N 2/067* (2013.01)

(58) Field of Classification Search
CPC ..... H01L 41/083; H01L 41/047; H01L 41/39; H01L 41/107; H01L 41/0472
USPC ..................... 310/366, 316.01, 317
See application file for complete search history.

(56) References Cited

U.S. PATENT DOCUMENTS

| | | | | |
|---|---|---|---|---|
| 3,489,931 A | * | 1/1970 | Teaford .................. | 310/331 |
| 3,531,742 A | * | 9/1970 | Takehiro et al. .......... | 333/187 |
| RE27,116 E | * | 4/1971 | Miller et al. ............ | 310/359 |
| 3,590,287 A | * | 6/1971 | Berlincourt et al. ...... | 310/321 |
| 4,454,441 A | * | 6/1984 | Taniguchi ............... | 310/328 |
| 4,564,782 A | * | 1/1986 | Ogawa ................... | 310/359 |

(Continued)

FOREIGN PATENT DOCUMENTS

| | | |
|---|---|---|
| CN | 1396668 A | 2/2003 |
| DE | 4140676 A1 | 6/1993 |

(Continued)

*Primary Examiner* — Thomas Dougherty
(74) *Attorney, Agent, or Firm* — McDermott Will & Emery LLP

(57) ABSTRACT

The invention relates to an actuator (1) having stacked piezoelements (16), first and second inner electrodes (5, 3) disposed alternatingly between the piezoelements (16), a first outer electrode (4) which is electrically conductively connected to the first inner electrode (5), a second outer electrode (2) which is electrically conductively connected to the second inner electrode (3), characterized in that the actuator (1) comprises a plurality of actuator segments (81, 82, 83, 84, 85) and that the second outer electrode (2) comprises separate electrode segments (21, 22, 23, 24, 25) each of which are electrically conductively connected to the second inner electrodes (3) in one of the actuator segments (81, 82, 83, 84, 85).

4 Claims, 4 Drawing Sheets

(56) References Cited

U.S. PATENT DOCUMENTS

Figure 5:
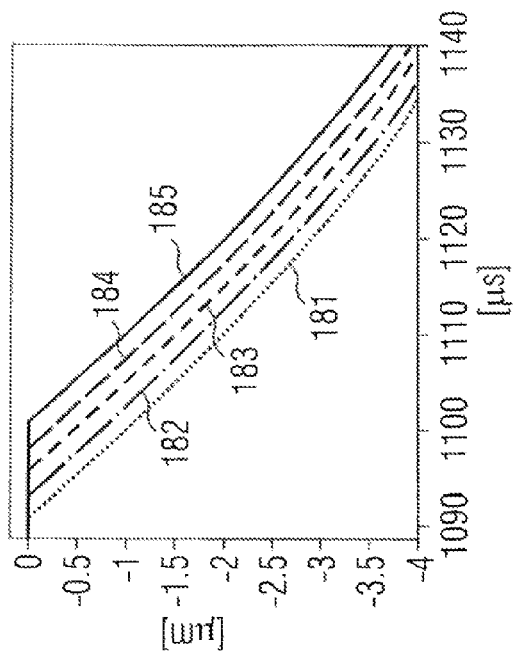

| | | | |
|---|---|---|---|
| 4,649,313 A * | 3/1987 | Ogawa et al. | 310/358 |
| 4,932,119 A | 6/1990 | Ealey et al. | |
| 4,997,177 A | 3/1991 | Mori et al. | |
| 5,686,777 A | 11/1997 | Chang | |
| 6,577,044 B1 * | 6/2003 | Li | 310/366 |
| 6,765,337 B1 | 7/2004 | Heinz et al. | |
| 2003/0098633 A1 * | 5/2003 | Nishimura et al. | 310/366 |
| 2004/0145632 A1 | 7/2004 | Lee et al. | |
| 2007/0200109 A1 | 8/2007 | Sciortino et al. | |
| 2013/0270968 A1 * | 10/2013 | Gabl | 310/366 |
| 2014/0001920 A1 * | 1/2014 | Auer et al. | 310/317 |

FOREIGN PATENT DOCUMENTS

| | | | | |
|---|---|---|---|---|
| DE | 19802302 A1 | 7/1999 | | |
| DE | 10321705 A1 | 12/2004 | | |
| DE | 102004025073 A1 | 1/2005 | | |
| DE | 102007046315 A1 | 4/2009 | | |
| EP | 1821351 A1 | 8/2007 | | |
| JP | S62073787 A | 4/1987 | | |
| JP | 63-078582 | 4/1988 | | |
| JP | 63120480 A | 5/1988 | | |
| JP | S63194377 A | 8/1988 | | |
| JP | 01093184 A | 4/1989 | | |
| JP | 05-160459 | * 12/1991 | | 310/366 |
| JP | H05327054 A | 12/1993 | | |
| JP | 07-223315 A | * 8/1995 | | B41J 2/045 |
| JP | 07223315 A | 8/1995 | | |
| JP | 2004216899 A | 8/2004 | | |
| JP | 2005-347484 A | 12/2005 | | |
| JP | 2009266921 A | 11/2009 | | |
| JP | 2010245187 A | 10/2010 | | |

* cited by examiner

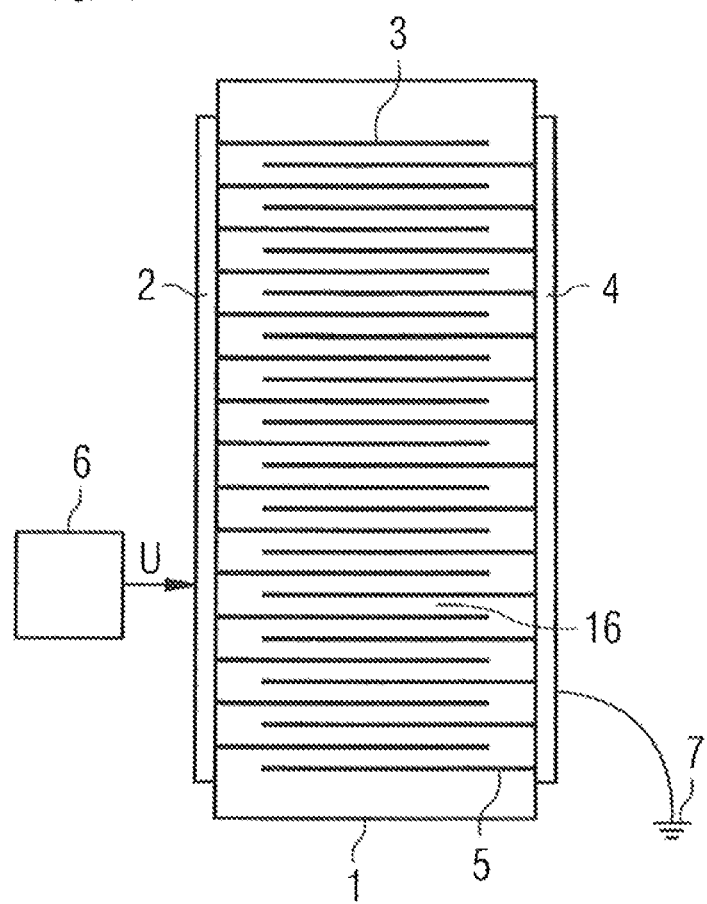

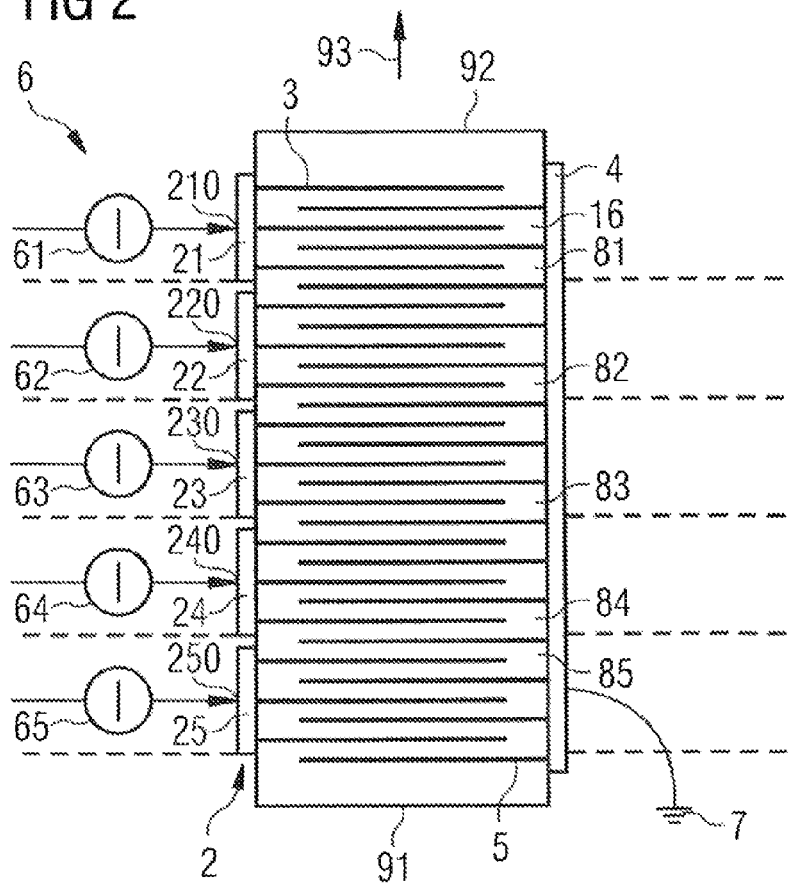
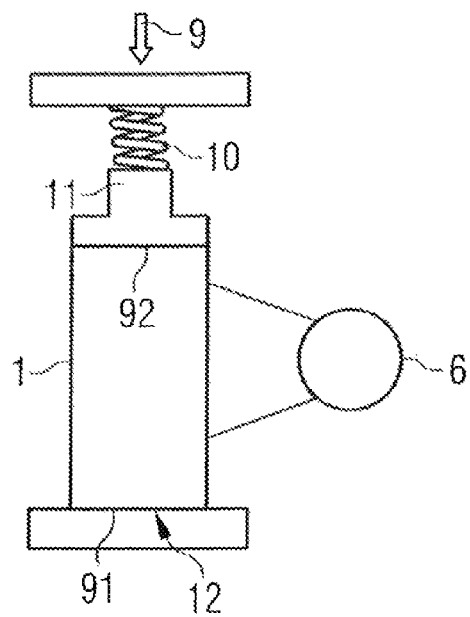

ACTUATOR, ACTUATOR SYSTEM AND ACTUATION OF AN ACTUATOR

Actuators, for example multilayer actuators, are used in a variety of fields; one example is injection systems for engines. One problem in the case of very short switching times, that is to say in the case of highly dynamic applications, is that of ensuring continuous operation. This problem occurs in the case of internal combustion engines, for example. For efficient operation of internal combustion engines, it is advantageous if the needle of the injection system can be opened and closed in a manner enabling good regulation and rapidly. For this purpose, in injection systems, the needle control can be effected by piezoelectric actuators. In applications in automobile engines, these actuators have to be able to be operated continuously with very steep actuation slopes. Problems in the case of such highly dynamic actuation of actuators can arise on account of inertial forces that lead to mechanical tensile stresses. These tensile stresses can bring about uncontrolled crack growth in the ceramic body of the actuator and thus potentially lead to the failure of the component. The problem of the occurrence of tensile stresses as a result of inertial forces is aggravated in the case of direct control with long actuators and short switching times.

This problem can be solved by means of an external mechanical prestress of the actuator. By applying an external prestressing force, it is possible to shift the stress level in the actuator into the compressive range. The mechanical prestress can be applied by means of a spring system. What is wanted here is a reliable system having high prestressing force and at the same time low stiffness for reducing the additional load of the actuator, and little movement of the mass for reducing the additional inertial forces. Moreover, the deflection capability of the actuators is dependent on the prestressing force. At high prestressing forces, with the same electrical actuation, that is to say with the same charging energy, the deflection of piezoactuators is greatly reduced.

The problem addressed is that of providing an actuator which is improved with regard to the aspects mentioned above.

The problem is solved by means of an actuator comprising the features of patent claim 1. Provision is made of an actuator comprising piezoelements arranged in a stacked fashion, first and second internal electrodes arranged alternately between the piezoelements, a first external electrode, which is electrically conductively connected to the first internal electrodes, a second external electrode, which is electrically conductively connected to the second internal electrodes. The actuator comprises a plurality of actuator sections, and the second external electrode comprises separate electrode segments, which are electrically conductively connected in each case to the second internal electrodes in one of the actuator sections. Each actuator section is electrically conductively connected only to one portion of the second internal electrodes. The separate electrode segments which do not touch one another or are not directly electrically conductively connected to one another allow the actuator sections to be actuated in a temporally shifted manner, such that the expansion process is not activated simultaneously for all the piezoelements, but rather in a temporally shifted manner.

The actuator comprises a plurality of sections, each having piezoelements and internal electrodes, which are actuated in a time-shifted manner. The actuation is not effected simultaneously for all regions of the entire actuator, but rather is effected in a time-shifted manner for the individual sections thereof. The time shift is advantageously chosen such that it corresponds exactly to the velocity of sound in the actuator. As a result, during the expansion of the actuator, the elastic partial waves are superimposed in such a way as to result in a significantly shorter slope time for the expansion of the actuator than would be the case with simultaneous actuation of the external electrode. The lower limit of the slope time is no longer limited by the length of the entire actuator, but rather by the length of the individual regions.

On account of the temporally shifted electrical actuation of locally separated electrode segments, the elastic expansions in the actuator which arise on account of inertial forces during highly dynamic operation can thus be compensated for in a targeted manner with the piezoelectric expansions. The time-shifted actuation makes it possible to better control the mechanical stress level in the actuator, and continuous operation with short switching times is ensured. Such sequential actuation of the actuator sections is achieved by means of the segmented external electrode. A further advantage of this solution is that there is no need to increase a static prestressing force and, in this regard, structural measures on a prestressing system and the actuator are also obviated. This possibility for avoiding tensile stress is well suited to long actuators, such as are required for the direct control of the valve needle. The targeted electrical actuation of actuator sections serves for reducing elastic expansions that are caused by inertial forces during highly dynamic operation. The time delay between the actuations of the actuator sections is chosen such that the elastic expansions are compensated for or reduced. The elastic expansions caused by inertial forces during highly dynamic operation are reduced by means of the targeted electrical actuation of the actuator sections.

Further advantageous configurations of the invention are specified in the dependent patent claims.

The invention is explained below on the basis of the embodiments with reference to the drawings.

Figure 7:
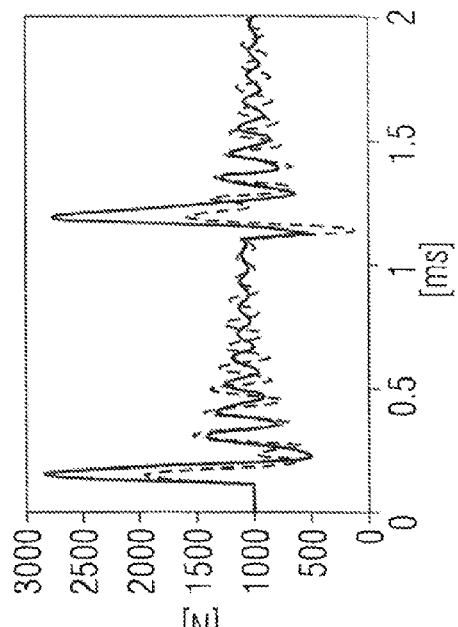
Figure 4:
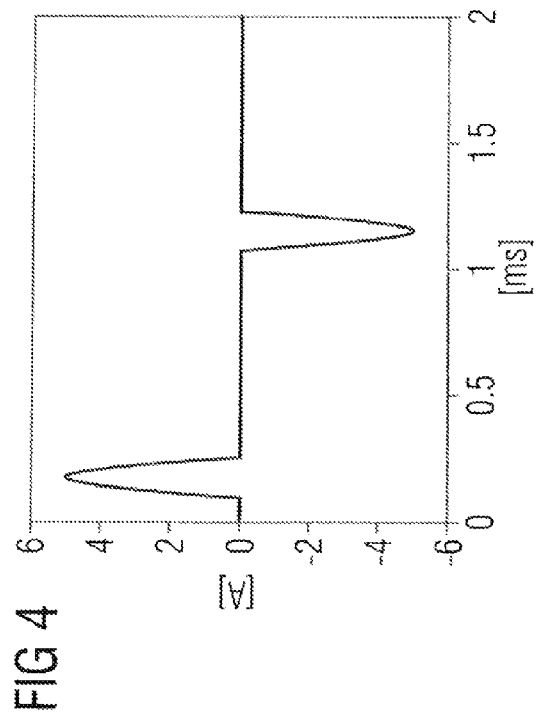
Figure 6:
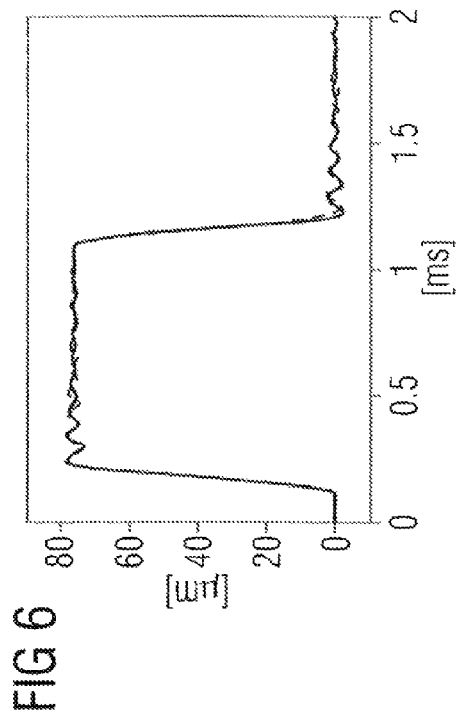
Figure 9:
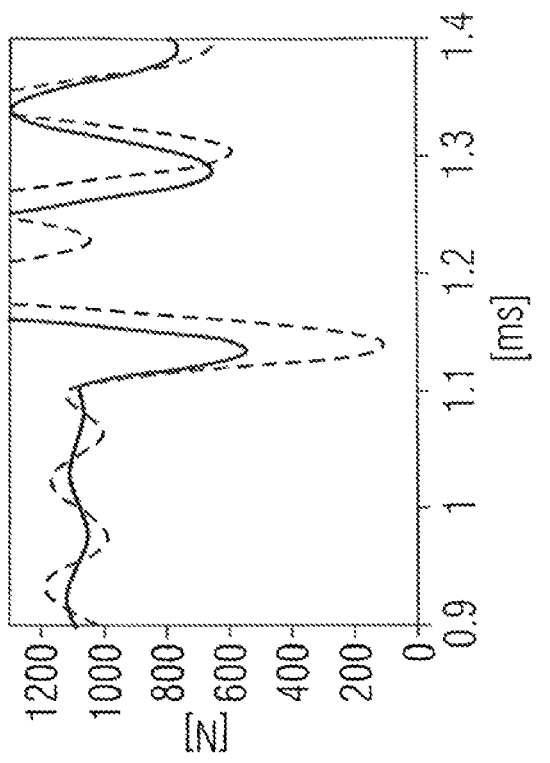
Figure 8:
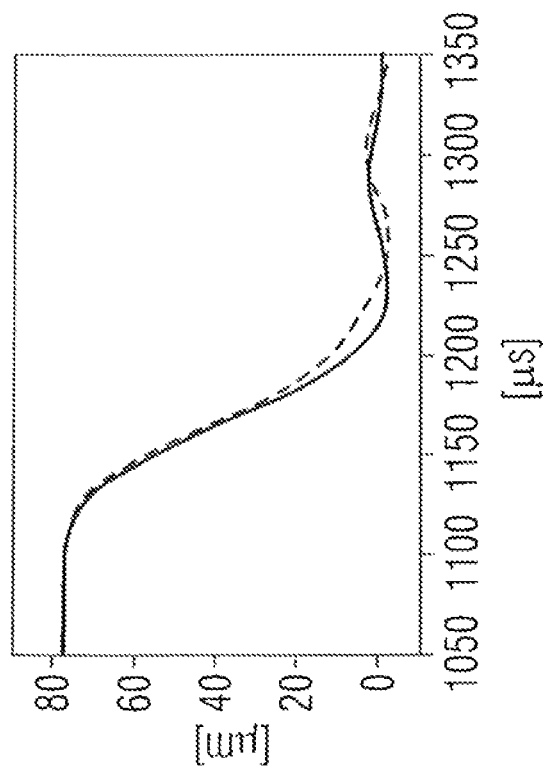

In the figures:

FIG. 1 shows an embodiment of an actuator without segmented external electrodes, FIG. 2 shows an embodiment of an actuator comprising a segmented external electrode, FIG. 3 shows a model for simulating the dynamic operation of an actuator comprising a segmented external electrode in comparison with an actuator without a segmented external electrode, FIG. 4 shows the actuation of the simulation model in FIG. 3, wherein the current is represented against time, FIG. 5 shows details from FIG. 4, FIG. 6 shows the deflection against time, FIG. 7 shows the force against time at the fixed actuator base, FIG. 8 shows details from FIG. 6, and FIG. 9 shows details from FIG. 7.

FIG. 1 shows a schematic sectional illustration of a conventional multilayer actuator 1 comprising piezoelements 16 arranged in a stacked fashion. First internal electrodes 5 and second internal electrodes 3 are arranged alternately between the piezoelements 16. The first internal electrodes 5 are electrically conductively connected to a first external electrode 4. The second internal electrodes 3 are electrically conductively connected to a second external electrode 2. The first and second internal electrodes 5 and 3 are in each case led to an outer side of the actuator 1 and are electrically conductively connected there to the first external electrode 4 and second external electrode 2, respectively. This can be effected, for example, by applying a metal paste by printing or by soldering on metallic plates which form the external electrodes 4, 2.

The first external electrode 4 is connected to a reference-ground potential 7. An actuation arrangement 6 applies an actuation signal, for example a time-variable actuation potential, to the second external electrode 2, such that an actuation voltage is present between the first and second internal electrodes, the actuator 1 being expanded or compressed depending on said actuation voltage.

As a result of the actuation voltage being applied, the actuator 1 experiences a stroke. The actuator 1 is expanded in a finite time. The actuator 1 is compressed by an opposite voltage being applied.

FIG. 2 shows an embodiment of a multilayer actuator comprising a first external electrode 4 and a segmented second external electrode 2, which has separate electrode segments 21, 22, 23, 24, 25. The separate electrode segments 21, 22, 23, 24, 25 are spatially separated from one another. They are neither directly electrically conductively connected to one another nor do they touch one another. The first external electrode 4 is connected to a reference-ground potential 7. The electrode segments 21, 22, 23, 24, 25 each have a terminal 210, 220, 230, 240, 250, via which they are connected to an actuation arrangement 6. Actuation signals can be applied via the terminals 210, 220, 230, 240, 250.

The segmented external electrode 2 can be produced for example by imprinting a metal paste and subsequent metallization cofiring. Further contact-connection can be implemented for example by soldering metallic screen fabric pieces onto the metallization segments or by soldering on a plurality of individual wires.

The actuator 1 comprises first and second internal electrodes 5, 3, which are electrically conductively connected to the first external electrode 4 and the second external electrode 2, respectively. The actuator 1 comprises a plurality of actuator sections 81, 82, 83, 84, 85. Each axially extended actuator section 81, 82, 83, 84, 85 corresponds to the axial extent of the electrode segments 21, 22, 23, 24, 25. The first electrode segment 21 is electrically conductively connected to the second internal electrodes 3 in the first actuator section 81. The second electrode segment 22 is electrically conductively connected to the second internal electrodes 3 in the second actuator section 82. The third electrode segment 23 is electrically conductively connected to the second internal electrodes 3 in the third actuator section 83. The fourth electrode segment 24 is electrically conductively connected to the second internal electrodes 3 in the fourth actuator section 84. The fifth electrode segment 25 is electrically conductively connected to the second internal electrodes 3 in the fifth actuator section 85. By contrast, the first internal electrodes 5 in the actuator sections 81, 82, 83, 84, 85 are electrically conductively connected to the same first, continuous external electrode 4. In another embodiment, the first external electrode 4 is also segmented.

The electrical actuation of the actuator sections 81, 82, 83, 84, 85 by means of the control arrangement 6 can be carried out by means of a plurality of independent current sources 61, 62, 63, 64, 65. Alternatively, proceeding from one current source, it is possible to realize a temporal shift between the actuation pulses for the actuator sections 81, 82, 83, 84, 85 by corresponding impedances upstream.

The actuator 1 is fixed at the actuator base 91 at the fifth section segment 85, such that when the actuator 1 expands axially, the actuator head 92 moves in a direction 93 axially away from the actuator base 91. The electrode segments 21, 22, 23, 24, 25 are actuated in such a way that firstly the actuator section 81 closest to the actuator head 92 is actuated, then the actuator section 82 adjacent thereto is actuated in a time-shifted manner, and so on, until lastly the actuator section 85 closest to the actuator base 91 is actuated. The loads occurring as a result of the inertial forces are reduced as a result of this actuation, since firstly that section 81 of the actuator 1 which experiences the greatest change in movement during the expansion of the actuator 1 is caused to move or experiences expansion, which reduces the load. The time delay described above can be impressed both in the case of the signals by means of which the expansion of the actuator 1 is initiated and in the case of the signals by means of which the compression of the actuator 1 is initiated, or only in the case of one of these two kinds of signals.

FIG. 3 shows an arrangement for illustrating the functioning of the proposed sequential electrical actuation of actuators 1, which enables a simulation of the actuator dynamics. The simulation model reflects boundary conditions of actuator operation in an injection system in a simplified manner. The mechanical boundary conditions are firstly the bearing of the actuator 1 on an ideally stiff, fixed support plate, namely the fixed restraint 12, and on the opposite side the coupling to a system comprising spring 10 and centrifugal mass 11, which system is concomitantly moved during an actuator deflection. A force 9 acts on the spring 10. The electrical actuation of the actuator 1 is effected by means of the pre-definition of specific current pulses, that is to say current or charge control by the control arrangement 6. In the fundamental one-dimensional simulation model, actuator deflection and force are calculated as functions of time and the position along the actuator axis, as is the actuator voltage.

FIGS. 4 to 9 illustrate the results of two simulations of actuators 1 which have a length of 40 mm and which are actuated with current pulses having a switching time of 150 µs. An actuator 1 comprising non-segmented external electrodes 4, 2, as illustrated in FIG. 1, is compared with an actuator 1 comprising a second external electrode 2 comprising five separately actuatable electrode segments 21, 22, 23, 24, 25, as illustrated in FIG. 2. The time shift between control signals for adjacent electrode segments is 2.5 µs.

FIG. 4 shows the temporal profile of the actuation with sinusoidal half-cycle current pulses for the actuator 1 comprising a segmented external electrode 1. The currents are represented against time. The temporal profile of the signal for actuating the actuator 1 comprising continuous external electrodes corresponds to the signal for actuating one of the segments.

FIG. 5 shows in detail the current pulses during the switch-off process. The electrode segment 25 closest to the fixedly restrained actuator base 91 is actuated last. The corresponding signal profile is illustrated with a solid line. The electrode segment 21 furthest from the fixedly restrained actuator base 91 or closest to the mass 11 is actuated first. The corresponding signal profile is illustrated with a dotted line. The electrode segment 22 adjacent to the electrode segment 21 furthest from the actuator base 91 is actuated next. The electrode segment 23 adjacent thereto is actuated next, and then the electrode segment 24 adjacent thereto. The electrode segment 25 closest to the fixedly restrained actuator base 91 or furthest from the mass 11 is actuated last. The corresponding signal profile is illustrated with a solid line.

FIG. 6 shows the deflection or stroke against time at the free actuator end 92. FIG. 7 illustrates the force at the fixedly restrained actuator base 91. The largest force amplitudes occur at this location. The results for the actuator 1 comprising non-segmented external electrodes are illustrated as dashed lines in FIGS. 6 to 9. The results for the actuator 1 comprising a segmented external electrode 2 are illustrated as solid lines in FIGS. 6 to 9. FIG. 8 shows a temporal segment from FIG. 6. Line 181 shows the actuation of the first actuator section 81. Line 182 shows the actuation of the second actuator section 82. Line 183 shows the actuation of the third actuator section 83. Line 184 shows the actuation of the fourth actuator section 84. Line 185 shows the actuation of the fifth actuator section 85. In the simulation example mentioned, the temporal sequence of the actuation signals for the sections in the case of expansion is opposite in comparison with the sequence in the case of compression.

FIG. 7 shows the force profiles at the fixedly restrained actuator base 91 against time. A comparison of the force profiles shows that the undershoot which occurs during the switch-off process is significantly reduced in the case of the sequentially actuated actuator 1, as is clearly discernible in FIG. 9, which shows a temporal segment from FIG. 7 in detail. Pronounced force undershoots with almost complete loss of the compressive prestress, such as occur in the conventional actuator, are to be avoided for continuous operation of actuators. The simulation shows that the minimum prestressing force can be significantly increased on account of the sequential actuation. The graphs in FIGS. 6 and 8 show that, as a result of the sequential actuation of the different actuator sections, no switching delay occurs in the actuator stroke of the actuator, rather the switching process is even accelerated.

It should be noted that the features of the embodiments can be combined.

REFERENCE SIGNS

1 Actuator
4, 2 External electrode
5, 3 Internal electrode
6 Control arrangement
7 Reference-ground potential
9 Force
10 Spring
11 Mass
12 Restraint
16 Piezoelement
21, 22, 23, 24, 25 Electrode segment
61, 62, 63, 64, 65 Current sources
81, 82, 83, 84, 85 Actuator section
91 Actuator base
92 Actuator head
93 Direction
210, 220, 230, 410, 420, 430 Terminal
181, 182, 183, 184, 185 Line

The invention claimed is:

1. An actuator system comprising:
   an actuator comprising:
   piezoelements arranged in a stacked fashion;
   first and second internal electrodes arranged alternately between the piezoelements;
   a first external electrode, which is electrically conductively connected to the first internal electrodes;
   a second external electrode, which is electrically conductively connected to the second internal electrodes; and
   a plurality of actuator sections, wherein the second external electrode comprises separate electrode segments, which are electrically conductively connected in each case to the second internal electrodes in one of the actuator sections;
   a control arrangement, by means of which a first actuation signal can be applied to one of the actuator sections and a second actuation signal can be applied in a time-shifted manner to a further actuator section,
   wherein the actuator is expandable in one direction, and a first actuator section is arranged in this direction relative to a second actuator section,
   wherein the control arrangement is suitable for applying the second control signal to the second actuator section in a time-delayed manner with respect to the first actuation signal applied to the first actuator section, and
   wherein the time shift is chosen in a manner dependent on inertial forces in the actuator.

2. The actuator according to claim 1, wherein the first external electrode comprises separate electrode segments which are electrically conductively connected in each case to the first internal electrodes in one of the actuator sections.

3. The actuator according to claim 1 or 2, wherein the electrode segments of the second external electrode in each case comprise a terminal, to which a control signal can be applied.

4. An actuation of an actuator comprising:
   piezoelements arranged in a stacked fashion, first and second internal electrodes arranged alternately between the piezoelements,
   wherein the actuator comprises a plurality of actuator sections and a first actuation voltage is applied between the first and second internal electrodes in a first actuator section in a time-shifted manner with respect to a second actuation voltage applied between the first and second internal electrodes in a second actuator section,
   wherein the actuator is expandable in one direction,
   wherein the first actuator section is arranged in the direction relative to the second actuator section,
   wherein the second actuation voltage is time-delayed with respect to the first actuation voltage, and
   wherein the time shift is chosen in a manner dependent on inertial forces in the actuator.

\* \* \* \* \*